United States Patent [19]
Uchida et al.

[11] Patent Number: 5,479,029
[45] Date of Patent: Dec. 26, 1995

[54] SUB-MOUNT TYPE DEVICE FOR EMITTING LIGHT

[75] Inventors: Satoshi Uchida; Hiroaki Takuma; Katsuhiko Ikawa, all of Kyoto, Japan

[73] Assignee: Rohm Co., Ltd., Kyoto, Japan

[21] Appl. No.: 220,586

[22] Filed: Mar. 31, 1994

Related U.S. Application Data

[63] Continuation of Ser. No. 967,085, Oct. 26, 1992, abandoned.

[30] Foreign Application Priority Data

Oct. 26, 1991 [JP] Japan ..................... 3-306558

[51] Int. Cl.$^6$ ............ H01L 31/12; H01L 33/00; H01L 29/161; H01L 29/34
[52] U.S. Cl. .............. 257/81; 257/82; 257/99; 257/103; 257/185; 257/639; 257/649; 257/706; 257/717
[58] Field of Search ............... 257/81, 99, 639, 257/717, 82, 103, 185, 649, 706; 165/18

[56] References Cited

U.S. PATENT DOCUMENTS

| | | | |
|---|---|---|---|
| 3,593,070 | 7/1971 | Reed | 257/99 |
| 4,793,688 | 12/1988 | Aiki et al. | 350/252 |
| 4,803,361 | 2/1989 | Aiki et al. | 250/227 |
| 5,072,263 | 12/1991 | Watanabe et al. | 257/81 |
| 5,099,488 | 3/1992 | Ahrabi et al. | 372/361 |
| 5,113,232 | 5/1992 | Itoh et al. | 357/17 |

*Primary Examiner*—Rolf Hille
*Assistant Examiner*—Valencia Martin Wallace
*Attorney, Agent, or Firm*—Lowe, Price, LeBlanc & Becker

[57] ABSTRACT

The present invention provides a sub-mount type device for emitting light which has high speed response and yet can radiate heat sufficiently. The sub-mount type device for emitting light comprises a heat sink (4), a sub-mount body (62) mounted on the heat sink (4) which comprises an insulating layer (38) with a upper face and a lower face, a upper electrode (42) on the upper face and a lower electrode 44 and 36 on the lower face, the insulating layer having two parts of the insulating layer (38) thickness of which is different, and a chip (30) for emitting light above the thinner part (39) of the insulating layer (38).

18 Claims, 10 Drawing Sheets

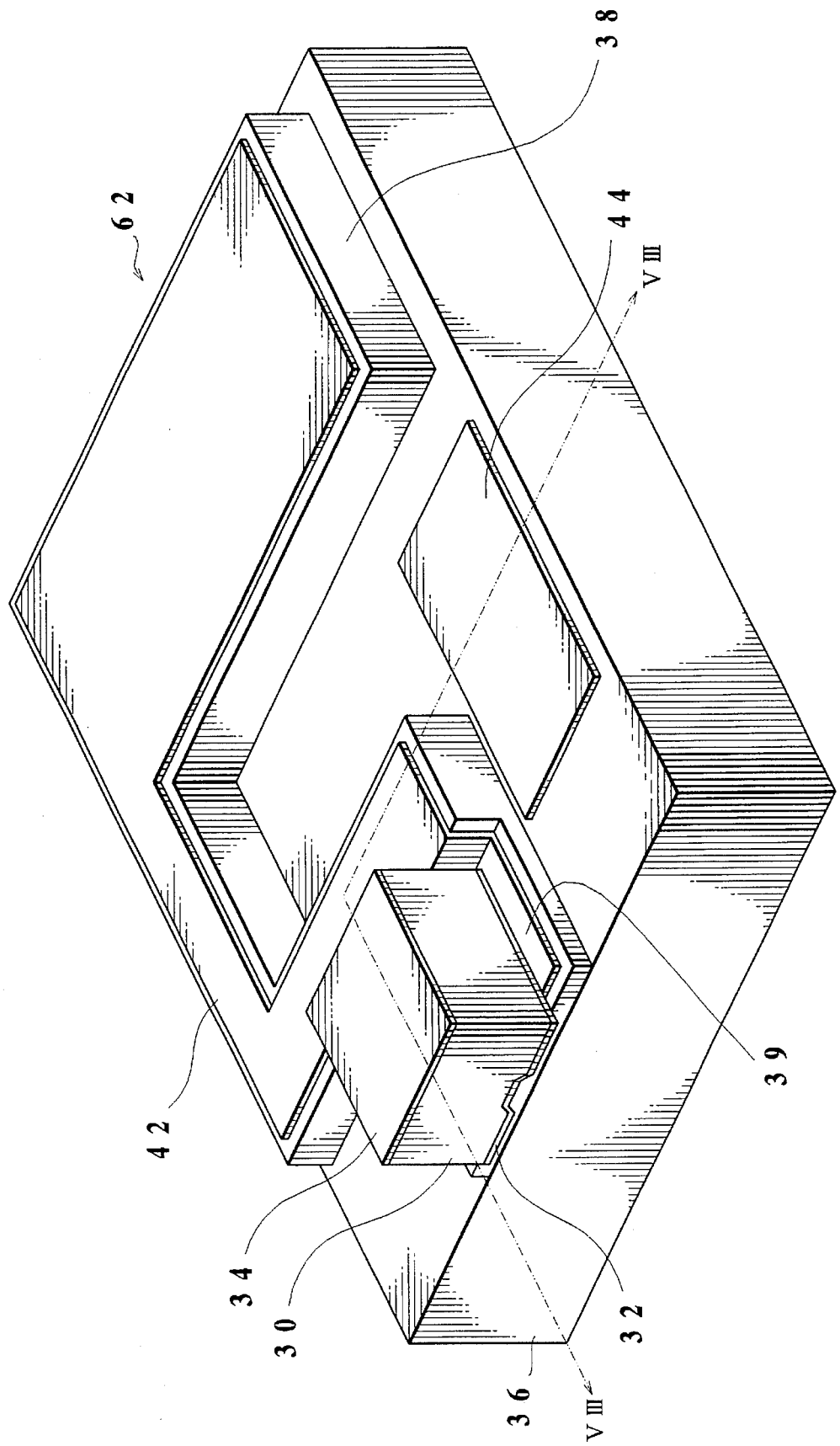

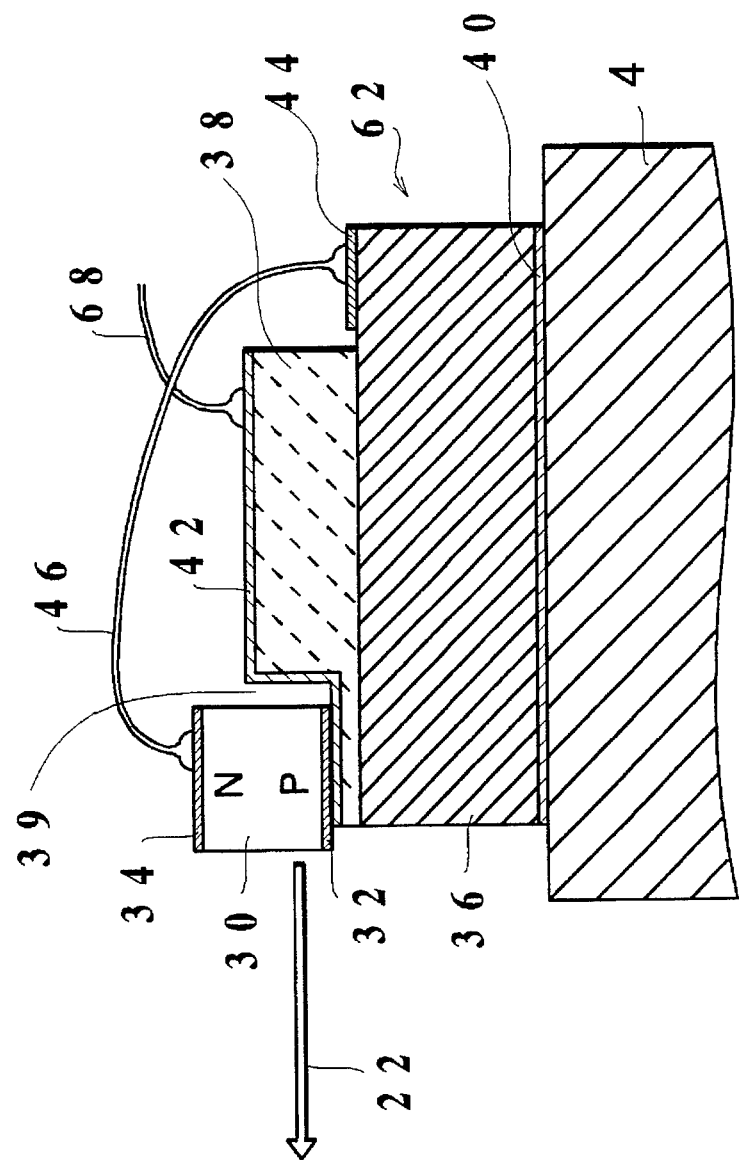

SUB-MOUNT TYPE DEVICE FOR EMITTING LIGHT

This application is a continuation of application Ser. No. 07/967,085, filed Oct. 26, 1992, now abandoned.

BACKGROUND OF THE INVENTION

1. Field of the Invention

The present invention relates to a sub-mount type device for emitting light and, more particularly, improvement in speed of its response.

2. Description of the Prior Art

FIG. 1 shows in perspective a light amplification by stimulated emission of radiation (LASER) chip 2 obtained by subjecting a P type substrate to epitaxial growth technique. Referring to FIG. 1, on the upper face of the P type substrate 5, a current-blocking layer 7, a cladding layer 9, a P type activation layer 11, a cladding layer 13 and an N type cap layer 15 are applied in this order. In this type of LASER chip 2, the activation layer 11 can emit light.

Each layer on the substrate 5 is very thin compared with thickness of the substrate 5. Actually, the thickness of the substrate 5 is a couple of ten of μm while the total thickness of the current-blocking layer 7, the cladding layer 9, the activation layer 11, the cladding layer 13 and the cap layer 15 is a couple of μm. Therefore, the activation layer is nearer to a chip negative electrode 20 applied on the cap layer 15 than to a chip positive electrode 18 applied on the lower face of the substrate 5.

A heat sink is Generally provided for the LASER chip 2 which Generates heat from the activation layer 11. Specifically, as shown in FIG.2, the LASER chip 2 is fixed to a heat sink 24 of large heat capacity so that the chip negative electrode 20 of the chip 2 attaches to the heat sink 24. That is, the LASER chip 2 of FIG. 1 is overturn and fixed to,the heat sink 24. That is because the activation layer 11 where heat is Generated is near to the chip negative electrode 20 than to the chip positive electrode 18.

Note that it is desirable that electric potential of the heat sink 24 is zero in order to prevent the electrical trouble because the heat sink 24 is connected with a case (not shown). Therefore, when power supply of positive is used the heat sink 24 is in negative side and when power supply of negative is used the heat sink 24 is in positive side. Since in semiconductor LASER there is many cases where power supply of positive is used it must be arranged that the heat sink 24 is at ground. That is why the chip negative electrode 20 is connected with the heat sink 24 as shown in FIG. 2.

As is described above, the positioning of FIG. 2 permits the heat sink 24 to be at Ground and to be brought out its capability of heat radiation.

Meanwhile, nowadays, a LASER chip is obtained by subjecting a N type substrate to metal organic chemical vapor deposition (MOCVD) technique or molecular beam epitaxicy (MBE) technique. FIG. 3 shows a LASER chip 30 obtained in any one of these ways. Referring to FIG. 3, differently from a LASER chip using P type substrate, an activation layer 10 formed on an N type substrate 81 is near to a chip positive electrode 32 than to a chip negative electrode 34. Therefore, when the LASER chip 30 is fixed to the heat sink 24 of large heat capacity so that the chip negative electrode 34 attaches to the heat sink 24 its capability of heat radiation may be brought out because the activation layer 10 where heat is generated is away the heat sink 24. On the other hand, when the LASER chip 30 is fixed to the heat sink 24 of large heat capacity so that the chip positive electrode 32 attaches to the heat sink 24 such a problem disappears but occurs a new problem where the heat sink 24 is not relatively at negative.

To solve the problem, a sub-mount body 26 is provided between the LASER chip 30 and the heat sink 4 as shown in FIG. 4. The sub-mount body 26 is constructed using a conductive substrate 36 with silicon, a insulating layer 38 of silicon oxide, a connecting electrode 40, a positive electrode 42 and a negative electrode 44, wherein the insulating layer 38 is formed on the upper face of the substrate 36, the positive electrode 42 attaches to the upper face of the insulating layer 38, the negative electrode 44 attaches to the upper face of the substrate 36 and the connecting electrode 40 attaches to the lower face of the substrate 36, the sub-mount body 26 is connected with a heat sink 4 through the connecting electrode 40. The LASER chip 30 is connected with the sub-mount body 26 wherein the chip positive electrode 32 attaches to the positive electrode 34 of the LASER chip 30 and the negative electrode of the sub-mount body 26.

The heat sink 4 is connected with the chip negative electrode 34 through the connecting electrode 40, the substrate 36, the negative electrode 44 and the golden wire 46. The fact permits the heat sink 4 to be at ground. Further, it is arranged that the activation layer 10 where heat is generated is positioned near to the sub-mount body 26. The fact permits the generated heat to be radiated sufficiently.

As is described above, in the case of the LASER chip 30, formed by using the N type substrate the sub-mount body 26 is provided between the heat sink 4 and the chip 30, which can solve the problem with heat radiation and electric potential.

Undesirable electrostatic capacity, however, is generated between the:positive electrode 42 and the conductive substrate 36 because the sub-mount body 26 have a capacitor structure wherein the insulating layer 38 is sandwiched between the positive electrode 42 and the conductive substrate 36. In view of the equivalent circuit 44 shown in FIG. 5, an electrostatic capacity C is parallel connected to the element of the chip 30. Therefore, voltage change in the element of the chip 30 can not occur rapidly according to voltage change between a terminal 50 and a terminal 52, which bar high speed response of the LASER chip 30. Since such a delay of response increases in proportion to volume of the electrostatic capacity, in order to obtain high speed response it is desirable that the electrostatic capacity can be reduced possibly.

Reduction in electrostatic capacity can be effected by thickening the insulating layer 38. However, when the insulating layer 38 is thick the generated heat can not radiate from the chip sufficiently because of increase in thermal resistance.

SUMMARY OF THE INVENTION

Accordingly, it is an object of the present invention to provide a sub-mount type device for emitting light which has high speed response and yet can radiate heat sufficiently.

A sub-mount type device for emitting light according to one embodiment of the present invention comprises:

a) a heat sink, b) a sub-mount body mounted on the heat sink which comprises an insulating layer with a upper face and a lower face, a upper electrode on the upper face and a lower electrode on the lower face, the insulating layer having two parts, thickness of which are different, and c) a chip for emitting light mounted above a thinner part of the two parts.

A sub-mount type device for emitting light according to another embodiment of the present invention comprises:

a) a heat sink, b) a sub-mount body mounted on the heat sink, comprising a substrate with silicon having a upper face and a lower face, a negative electrode on the upper face of the substrate, a connecting electrode on the lower face of the substrate, a layer of silicon oxide on the upper face of the substrate comprising two parts thickness of which is different, and a positive electrode on the silicon oxide layer, and c) a chip for emitting light which comprises a chip positive electrode, a activation layer and a chip negative electrode, mounted on the sub-mount body so that the chip positive electrode attaches to the sub-mount body.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 7 is a perspective view showing the detail of the sub-mount body.

FIG. 8 is a VIII—VIII sectional view to FIG. 7

DETAILED DESCRIPTION OF THE INVENTION

Figure 6:
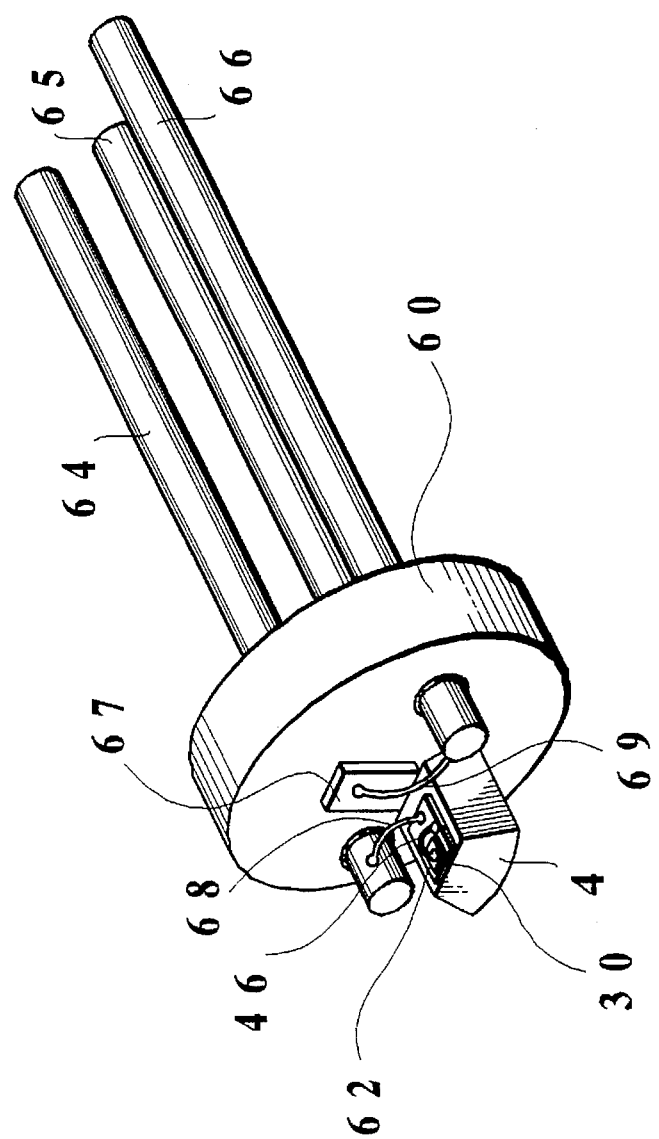
FIG. 6 is a perspective view showing a device for emitting light according to one embodiment of the present invention.

FIG. 6 shows a device for emitting light according to one embodiment of the present invention in perspective. A cap is not shown in FIG. 6 for simplicity. A heat sink 4 is provided on the one surface of a base 60. On the face of this heat sink 4 is fixed a sub-mount body 62 on which a LASER chip 30 is provided. A lead 65, which is fixed through the base 60, electrically connects with the heat sink 4. The heat sink 4 is electrically connected with a chip negative electrode of the LASER chip 30 through the sub-mount body 62 and a golden wire 46. A lead 64 is insulated from the base 60 and electrically connected with a chip positive electrode of the LASER chip 30 through a golden wire 68 and an electrode on the sub-mount body 62. When a voltage of 0 V is applied to the lead 65 and a positive voltage is applied to the lead 64 the LASER chip 30 can emit light.

A pin photo diode 67 for monitoring quantity of light is provided on the base 60. One terminal of the pin photo diode 67 is connected to the lead 65 through the base 60 while the other terminal thereof is connected to a lead 66 through a golden wire 69. That means the pin photo diode 67 is parallel connected to the LASER chip 30.

Figure 1:
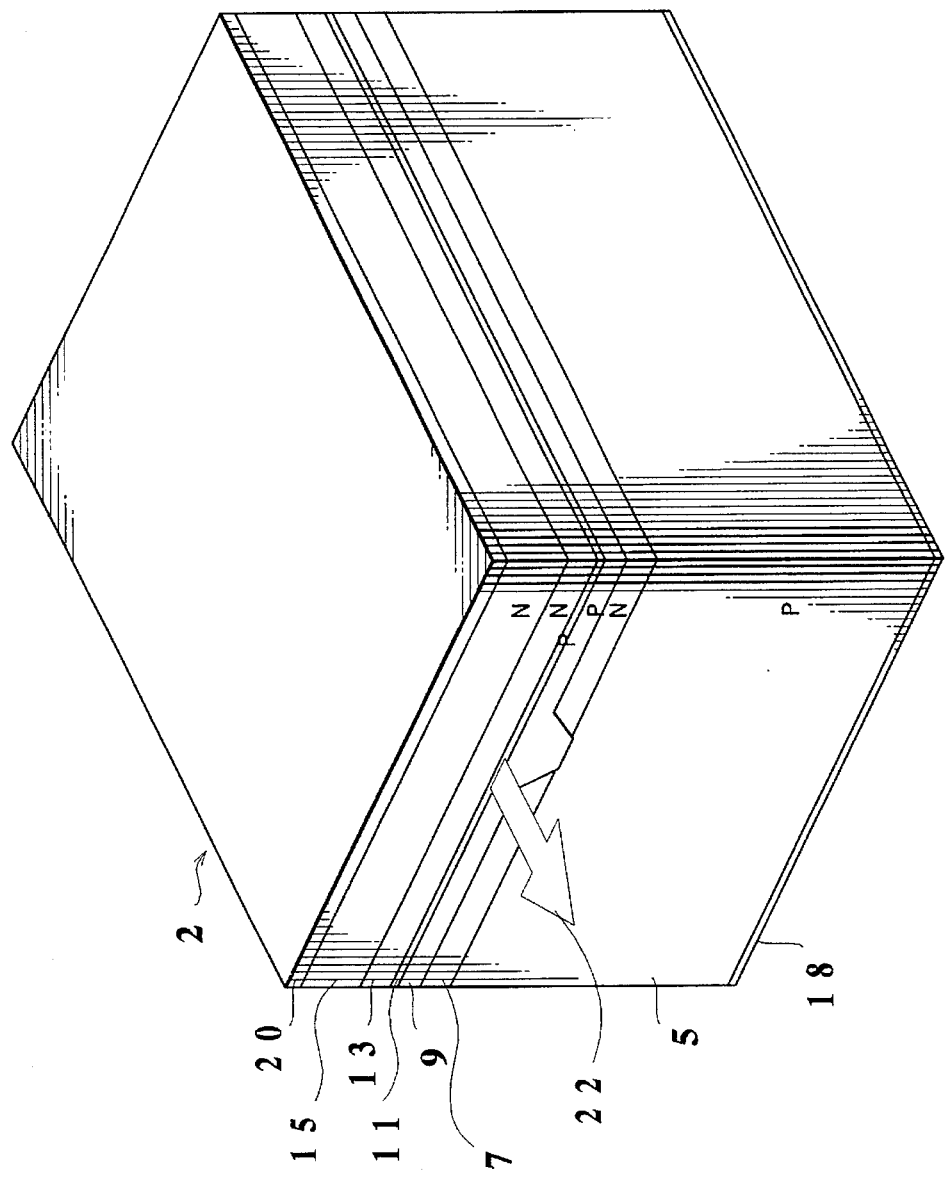
FIG. 1 is a perspective view showing a LASER chip 2 obtained by subjecting a P type substrate to epitaxial growth technique.
Figure 2:
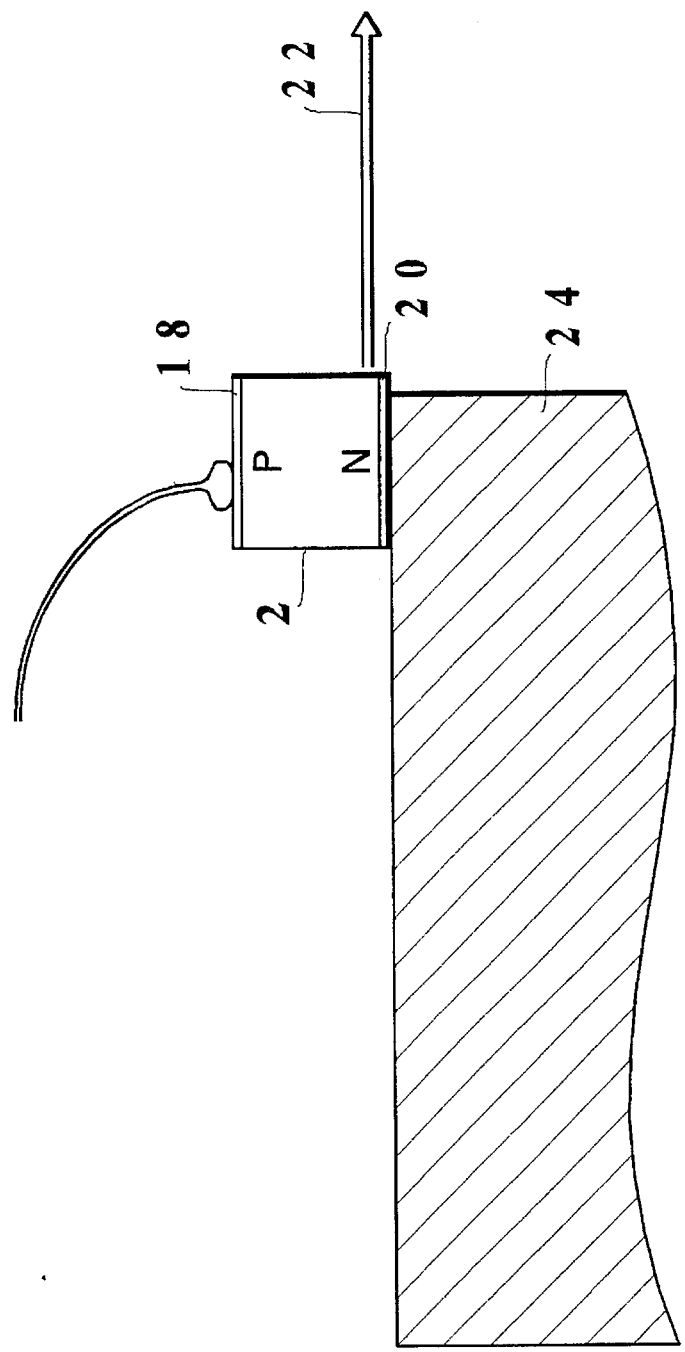
FIG. 2 is a sectional view showing a state wherein the chip 2 is mounted on the heat sink.
Figure 3:
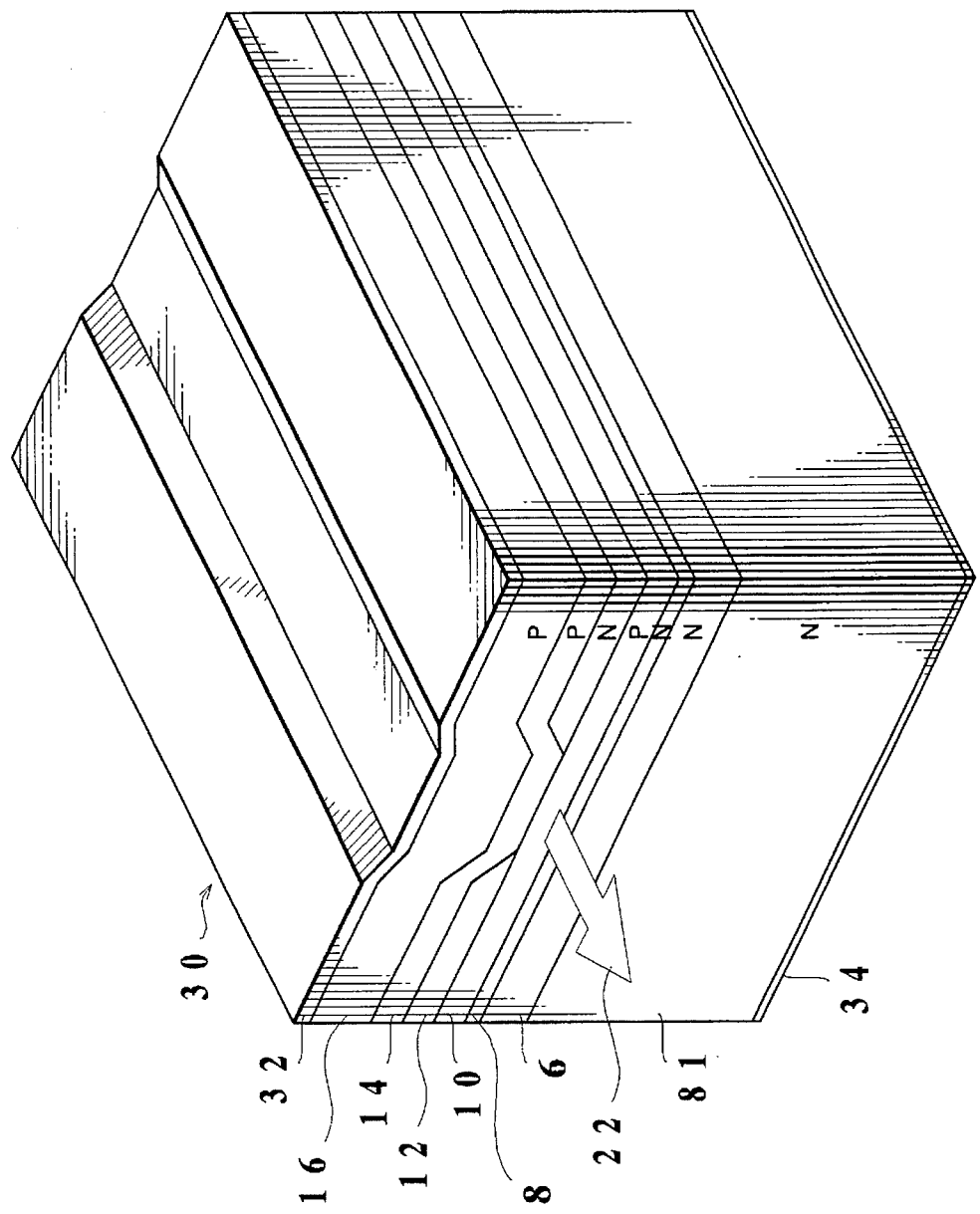
FIG. 3 is a perspective view showing a LASER chip 30 obtained by subjecting a N type substrate to epitaxial growth technique.
Figure 4:
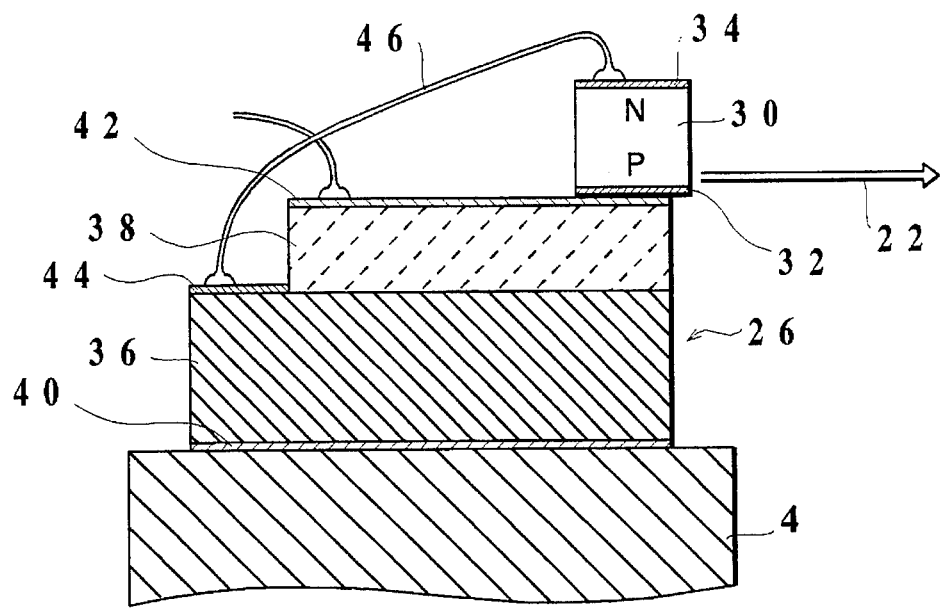
FIG. 4 is a sectional view showing a state where submount body is provided between the LASER chip and the heat sink. 4
Figure 5:
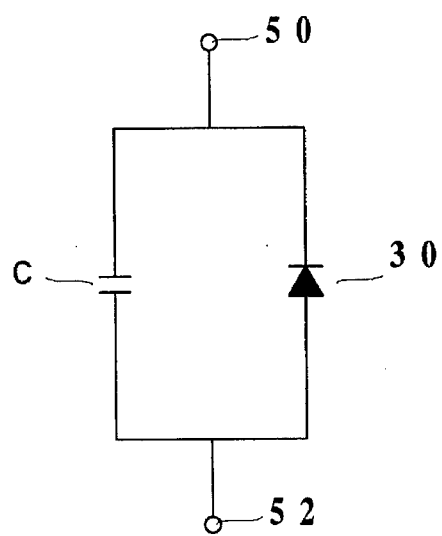
FIG. 5 is a view showing the equivalent circuit to the state of FIG. 4.

FIG. 7 shows the detail of the sub-mount body 62 shown in FIG. 6 in perspective. Referring to FIG. 7, a layer 38 of silicon oxide acting as an insulating layer is applied on the upper face of a conductive substrate 36 with silicon. The silicon oxide layer 38 have two parts thickness of which is different. Note that the one part 39 is thinner than the other part. A chip positive electrode 42 of aluminum acting as a positive electrode is applied on the upper face of the silicon oxide layer 38. On the upper face of the conductive substrate 36 on which the silicon oxide layer 38 is not applied, a chip negative electrode 44 of aluminum acting as a negative electrode is applied. The LASER chip 30 of FIG. 3 is fixed to the positive electrode 42 on the thinner part 39 so that the chip positive electrode 32 is connected with the positive electrode 42. The chip negative electrode 34 of the LASER chip 30 is connected with the negative electrode 44 of the sub-mount body 62 through a golden wire (not shown). On the lower face of the conductive substrate 36, a golden electrode 40 which is a connecting electrode is applied. This sub-mount body 62 is fixed on the surface of the heat sink 4.

As is described above, in this embodiment, the conductive substrate 36 and the golden electrode 40 form a lower electrode and the aluminum electrode 42 form a upper electrode.

FIG. 8 is a VIII—VIII sectional view to FIG. 7. As shown in FIG. 8, a step is provided in the upper face of the silicon oxide layer 38 so that the silicon oxide 38 have two part thickness of which is different. Note that the one part 39 is thinner than the other part. Therefore, the LASER chip 30 on the thinner part 39 is permitted to be positioned near the heat sink 4, which can bring out its capability of heat radiation. On the other hand, thickness of the thicker part of the silicon oxide layer 38 has more than a predetermined thickness in order to reduce electrostatic capacity between the positive electrode 42 and the conductive substrate 36. Therefore, the electrostatic capacity therebetween do not prevent response of high speed.

Noted that in this embodiment the thickness of the thinner part 39 of the silicon dioxide layer is 0.1 μm, and the thickness of the thicker part is 2 μm.

Although in this embodiment the silicon oxide layer 38 is used as insulating layer by virtue of manufacturing, in an alternative embodiment a layer of silicon nitride and aluminum oxide may be used as insulating layer.

Figure 9A:
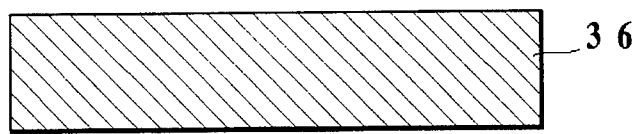
FIGS. 9A through 9F are VIII—VIII sectional views showing the manufacturing process of the sub-mount body 69.
Figure 9B:
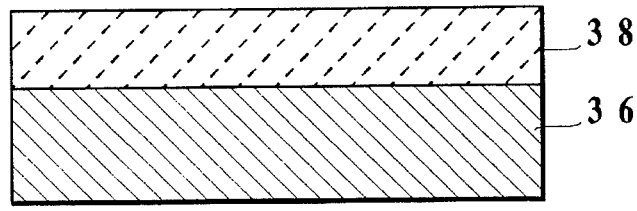
Figure 9C:
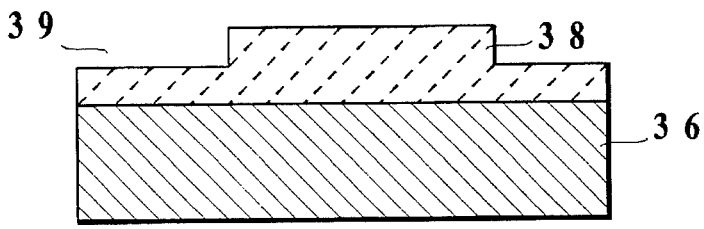
Figure 9D:
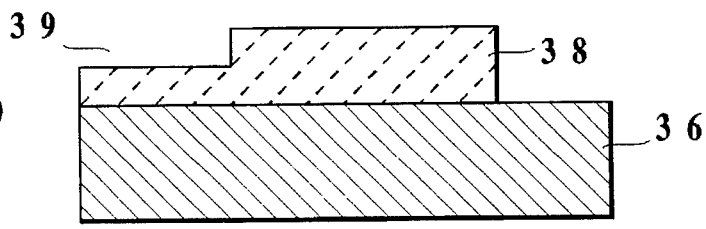

FIGS. 9A through 9F show the manufacturing process of the sub-mount body 62 in VIII—VIII sectional view. Referring to FIG. 9A, a conductive substrate 36 with silicon of N type or P type is prepared, thickness of which is 400 μm. Referring to FIG. 9B, the conductive substrate 36 is subjected to a thermal oxidation step wherein a silicon oxide layer about 2 μm in thickness is formed in the upper face of the substrate 36. Referring to FIG. 9C, the resulting substrate is then subjected to an etch step, wherein the thinner part 39 of the silicon oxide layer 38 and the unwanted silicon oxide layer are etched until their thickness reaches about 0.1 μm and then only the unwanted silicon dioxide layer is etched until the upper face of the conductive substrate 36 is exposed.

Figure 9E:
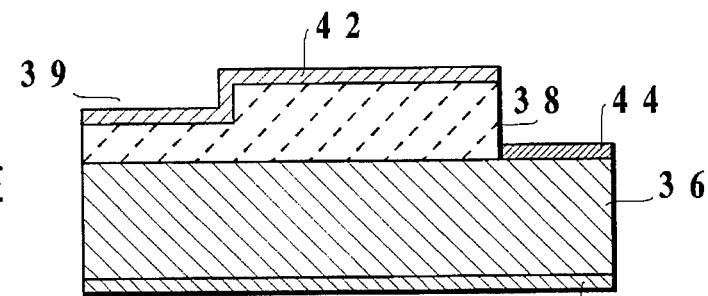
Figure 9F:
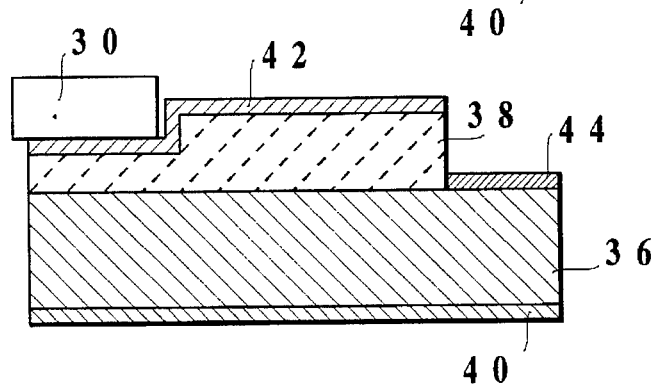

Referring to FIG. 9E, metalizations of aluminum are formed on the thicker part and on the exposed upper face of the substrate 36 by evaporate deposition technique to produce a positive electrode 42 and a negative electrode 44. Then, the lower face of the substrate 36 is subjected to a polish step whereby the thickness of the substrate become about 220 μm. A metalization of gold is formed on the lower face by evaporate deposition technique to produce a golden connecting electrode 40.

After a layer of material for die bonding is formed on the positive electrode area above the thinner part 39 of the silicon oxide layer 38 by evaporate deposition technique, the resulting sub-mount body is subjected to a dicing step to divide them into .On the layer of material for die bonding of each sub-mount body, the LASER chip 30 is mounted.

Figure 10:
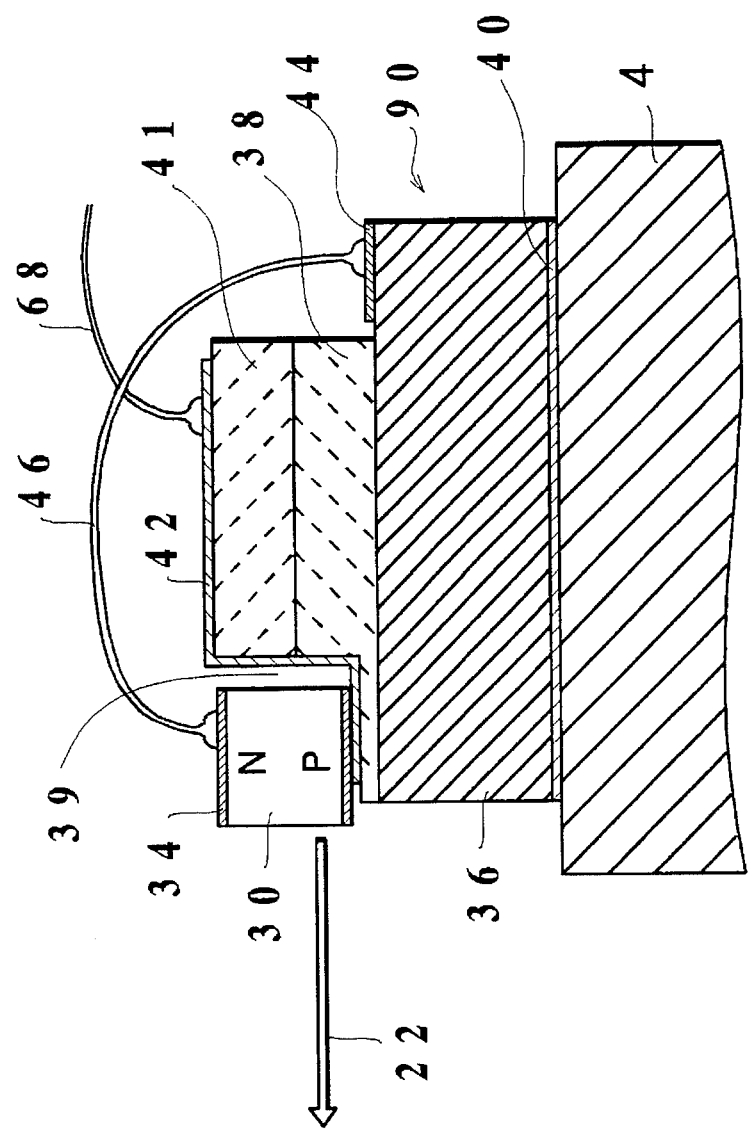
FIG. 10 is a view of the same section showing the detail of a sub-mount body 90 layer according to another embodiment of the present invention.

FIG. 10 shows the detail of a sub-mount body 90 layer according to another embodiment of the present invention in the same sectional view as FIG. 8. This sub-mount body 90 comprises a silicon oxide layer 38 and a silicon nitride layer 41 thereon, the two layer form an insulating layer. Meanwhile, in order to reduce electrostatic capacity between positive electrode 42 and a conductive substrate 36, it is necessary to form an insulator therebetween of more than a predetermined thickness. But when silicon oxide is formed into a too thick insulator therebetween by thermal oxidation technique the silicon oxide insulator has little reliability.

Therefore, the silicon nitride layer 41 is provided on the silicon oxide layer 38 in order to obtain the insulator therebetween of the predetermined thickness.

Figure 11A:
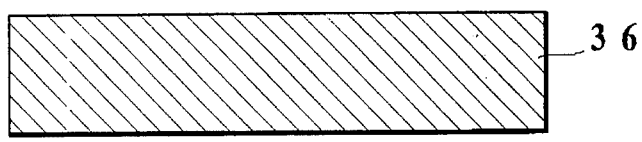
FIGS. 11A through 11E are views of the same section showing the manufacturing process of the sub-mount body 90.
Figure 11B:
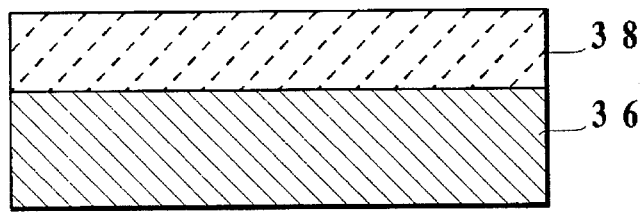

FIGS. 11A through lie show the manufacturing process of the sub-mount body 90 of FIG. 10 in the same sectional view. Referring to FIG. 11A, a conductive substrate 36 with silicon of N type or P type is prepared, thickness of which is 400 μm. Referring to FIG. 11B, the conductive substrate 36 is subjected to a thermal oxidation step wherein a silicon oxide layer 38 about 2 μm in thickness is formed in the upper face of the substrate.

Figure 11C:
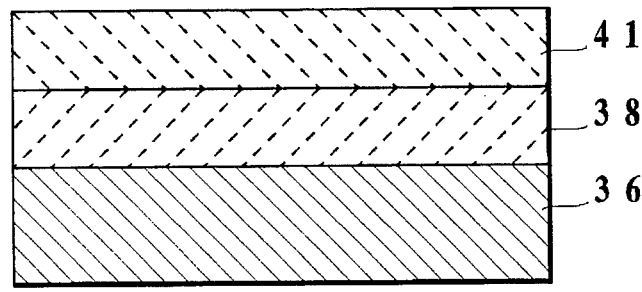
Figure 11D:
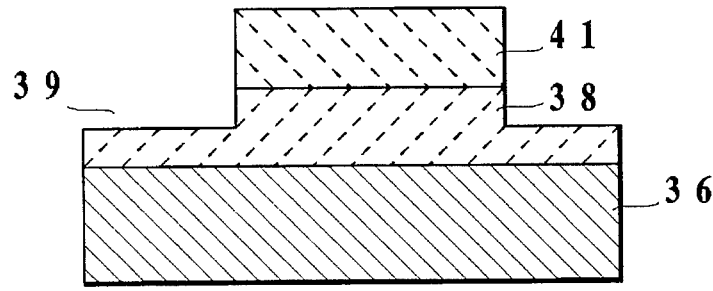
Figure 11E:
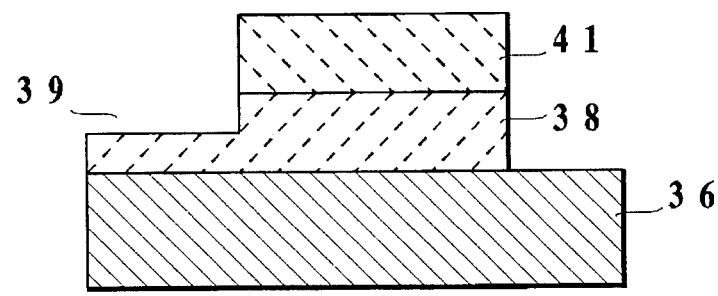

Referring to FIG. 11C, the resulting substrate is subjected to a low pressure chemical vapor deposition (LPCVD) step wherein a silicon nitride ($Si_3N_4$) layer about 2 μm in thickness is formed on the silicon oxide layer. Referring to FIG. 11D and 11E, the resulting substrate is then subjected to an etch step, wherein the thinner part 39 of the insulating layer 38 and 41 and the unwanted insulating layer is etched until their thickness reaches about 0.1 μm and then only the unwanted silicon oxide layer is etched until the upper face of the conductive substrate 36 is exposed. The following steps is the same as described in the sub-mount body 62 of Fig. 9E and FIG. 9F.

Although in the later preferred embodiment the silicon nitride layer 41 is used as insulator, in alternative embodiments any other oxides such as aluminum oxide is used as insulator.

Although in the preferred embodiments a step is provide the in the upper face of the insulating layer so that the insulating layer have two parts thickness of which are different, in alternative embodiments in the upper face of the insulating layer is provided a slop or any other shapes provided that the insulating layer have a part for heat radiation and another part for reducing the electrostatic capacity C.

Although in the preferred embodiment the LASER chip 30 is used as a chip for emitting light, in alternative embodiments a high intensity light emitting diode and a super luminescence diode may be used as a chip for emitting light.

As is described in the above embodiments, the present invention provide a sub-mount type device for emitting light which have an advantage in heat radiation without failing to response rapidly because the insulating portion having the two parts thickness of which is different.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A sub-mount type device for emitting light comprising:
   a) a heat sink having an upper face,
   b) a sub-mount body mounted on and disposed only over said upper face of said heat sink and in thermal contact with said upper face thereof, said sub-mount body comprising
      an insulating layer having an upper face and a lower face,
      an upper electrode mounted on said upper face of said insulating layer, and
      a lower electrode mounted on said lower face of said insulating layer, said lower electrode being disposed only over said upper surface of said heat sink and thermally and electrically coupled thereto,
   wherein said insulating layer has a first portion and a second portion, the thickness of said first portion being greater than that of said second portion and both first and second portions being formed to be disposed only on an upper surface of said lower electrode and thus being disposed above said upper surface of said heat sink, and
   c) a chip for emitting light, mounted to said upper electrode only upon a portion of said upper electrode located above said second portion of said insulating layer.

2. A sub-mount type device for emitting light according to claim 1
   wherein the insulating layer of the sub-mount body have a layer of silicon oxide.

3. A sub-mount type device for emitting light according to claim 1
   wherein the insulating layer of the sub-mount body have a layer of silicon nitride.

4. A sub-mount type device for emitting light according to claim 1
   wherein the insulating layer of the sub-mount body have a layer of aluminum oxide.

5. A sub-mount type device for emitting light according to claim 1
   wherein the insulating layer of the sub-mount body comprises two layers.

6. A sub-mount type device for emitting light according to claim 5
   wherein the insulating layer of the sub-mount body comprises a layer of silicon oxide and a layer of silicon nitride.

7. A sub-mount device for emitting light according to claim 1, wherein:

the lower electrode comprises a conductive substrate with silicon and a layer of gold formed on a bottom surface of said conductive substrate.

8. A sub-mount device according to claim 7 wherein:

the insulating layer is a layer of silicon oxide formed on an upper surface of said conductive substrate by oxidation of said silicon thereof.

9. A sub-mount type device for emitting light according to claim 7 wherein tile insulating layer comprises a silicon oxide layer and a layer of silicon nitride formed on the silicon oxide layer.

10. A sub-mount type device for emitting light according to claim 1 wherein the upper electrode is made up of aluminum.

11. A sub-mount type device for emitting light according to claim 1 wherein a transition between said first and second portions of said insulating layer comprises a step.

12. A sub-mount type device for emitting light according to claim 11, wherein:

a transition between said first and second portions comprises a step portion obtained by etching the insulating layer.

13. A sub-mount type device for emitting light according to claim 1 wherein the chip for emitting light is a LASER chip.

14. A sub-mount type device for emitting light according to claim 1 wherein the chip for emitting light is a high intensity light emitting diode.

15. A sub-mount type device for emitting light according to claim 1 wherein the chip for emitting light is a super luminescence diode.

16. A sub-mount type device for emitting light, comprising:

a) a heat sink having an upper surface, b) a sub-mount body mounted on said upper surface of said heat sink, said sub-mount body comprising a conductive substrate of silicon having an upper face and a lower face, a negative electrode mounted on the upper face of said conductive substrate, a connecting electrode mounted on the lower face of said conductive substrate, disposed only over and coupled to said upper surface of said heat sink in thermal contact therewith, a layer of silicon oxide on the upper face of the conductive substrate, adjacent said negative electrode, said layer of silicon oxide comprising a first part and a second part, the thickness of said first part being greater than that of said second part, and a positive electrode on said silicon oxide layer, disposed over at least a portion of both said first and said second parts of said silicon oxide layer, and c) a chip for emitting light, which comprises a chip positive electrode, an activation layer and a chip negative electrode, said chip being mounted on the sub-mount body so that the chip positive electrode attaches to the sub-mount body only to that portion of said positive electrode disposed over said second part of said silicon oxide substrate and is disposed over the upper surface of the heat sink.

17. The sub-mount type device of claim 1, wherein:

said chip has a negative electrode mounted on an upper surface, and a positive electrode mounted on a lower surface, said upper electrode mounted on said upper face of said insulating layer is electrically coupled to said positive electrode of said chip for emitting light, and said lower electrode mounted on said lower face of said insulating layer is electrically coupled to said negative electrode of said chip for emitting light.

18. The sub-mount type device of claim 17, wherein:

current passing through said chip for emitting light flows in a first direction from said positive electrode mounted on said lower surface, to said negative electrode mounted on said upper surface, and current passing through said sub-mount flows in a second direction opposite that of said first direction from said upper electrode to said lower electrode.

* * * * *